United States Patent [19]
Heep et al.

[11] Patent Number: 5,898,890
[45] Date of Patent: Apr. 27, 1999

[54] METHOD FOR TRANSFERRING DATA BETWEEN DEVICES BY GENERATING A STROBE PULSE AND CLAMPING A CLOCK LINE

[75] Inventors: Jerry J. Heep, Weatherford, Tex.; Douglas R. Curtis, Los Gatos, Calif.

[73] Assignee: AST Research, Inc., Irvine, Calif.

[21] Appl. No.: 08/908,771

[22] Filed: Aug. 7, 1997

Related U.S. Application Data

[63] Continuation of application No. 08/700,120, Aug. 20, 1996, abandoned, which is a continuation of application No. 08/365,321, Dec. 28, 1994, abandoned, which is a continuation of application No. 07/858,855, Mar. 27, 1992, abandoned.

[51] Int. Cl.[6] .............................. G06F 1/04; G06F 13/38
[52] U.S. Cl. ......................... 395/849; 395/850; 395/852; 395/878; 395/881; 395/308; 340/825.14
[58] Field of Search ....................... 340/825.14; 395/308, 395/849, 850, 852, 878, 881

[56] References Cited

U.S. PATENT DOCUMENTS

| | | | |
|---|---|---|---|
| 4,346,440 | 8/1982 | Kyu et al. ............................. | 395/200.2 |
| 4,361,876 | 11/1982 | Groves ..................................... | 395/852 |
| 4,402,079 | 8/1983 | Fellinger et al. ........................ | 370/84 |
| 4,417,304 | 11/1983 | Dinwiddie, Jr. ........................ | 395/845 |
| 4,438,498 | 3/1984 | Sekel et al. ............................. | 364/483 |
| 4,453,228 | 6/1984 | Loskorn .................................. | 395/286 |
| 4,458,197 | 7/1984 | Robinson ............................. | 324/73 AT |
| 4,492,916 | 1/1985 | Johnson ............................. | 324/600 D |
| 4,509,121 | 4/1985 | Rey et al. ............................... | 395/775 |
| 4,558,409 | 12/1985 | Goss et al. .............................. | 375/106 |
| 4,563,770 | 1/1986 | Lemelson et al. ....................... | 381/51 |
| 4,608,532 | 8/1986 | Ibar et al. ............................. | 324/73 R |
| 4,736,327 | 4/1988 | Power .................................... | 364/481 |
| 4,794,383 | 12/1988 | Havel ..................................... | 340/704 |
| 4,864,512 | 9/1989 | Coulson et al. ......................... | 364/481 |
| 5,012,223 | 4/1991 | Poulser, Jr. ......................... | 340/825.18 |
| 5,095,450 | 3/1992 | Shakra et al. ........................... | 395/114 |
| 5,144,444 | 9/1992 | MacLean ................................ | 348/312 |
| 5,233,346 | 8/1993 | Minerd et al. ..................... | 340/825.52 |
| 5,247,657 | 9/1993 | Myers ..................................... | 395/550 |
| 5,341,371 | 8/1994 | Simpson ................................ | 370/85.4 |
| 5,432,827 | 7/1995 | Mäder .................................... | 375/376 |

OTHER PUBLICATIONS

Ailawadoi, N.K. et al. Wavelength–Multiplexed Bit Synchronization in Optical Transmission in Globe Com —91: IEEE Global Telecommunications Conference, pp. 423–429. 1991.

Stallings, N., "Data and Computer Communications"(New York, MacMillan, 2d ed. 1988), pp. 99–103, 154.

8OC51–Based 8–Bit Microcontrollers Databook, Philips Semiconductors, 1993, pp. 136–161.

William Stallings, "Data and Computer Communications" pp. 102–103 (2d 1988).

*Primary Examiner*—Lance Leonard Barry, Esq.
*Attorney, Agent, or Firm*—Knobbe, Martens, Olson & Bear, LLP

[57] ABSTRACT

A first and second electronic devices are connected by two data lines arranged in a wired-AND configuration so that each device can signal the other device by forcing one of the two-wires into a "low" condition. An inventive method uses serial transfer of a predetermined numbers of bits in a digital word delimited by start and stop bits which are, in turn, defined by their relation to a clock signal on one of the data lines. The start and stop bits are chosen to be in a particular state during the "active" portion of the clock signal. Thus, the need for clocked gates or multivibrators is eliminated. In the preferred embodiment, the method and apparatus are used in a digital multimeter to intercouple a microprocessor and an electronic measuring circuit so that the microprocessor can control the measuring circuit and receive measured values from the circuit.

6 Claims, 9 Drawing Sheets

ASIC OUTPUT LATCH

FIG. 6 ic circuits. In addition, the necessity of detecting
METHOD FOR TRANSFERRING DATA BETWEEN DEVICES BY GENERATING A STROBE PULSE AND CLAMPING A CLOCK LINE This application is a continuation of U.S. patent application Ser. No. 08/700,120 now abandoned, filed on Aug. 20, 1996, which is a continuation of U.S. patent application Ser. No. 08/365,321 now abandoned, filed on Dec. 28, 1994, which is a continuation of U.S. patent application Ser. No. 07/858,855 now abandoned, filed on Mar. 27, 1992

FIELD OF THE INVENTION

This invention relates generally to a two-wire, bidirectional data bus for coupling two devices. More particularly, this invention relates to a two-wire, bidirectional data bus within a digital multimeter for coupling a microprocessor to an application specific integrated circuit.

BACKGROUND OF THE INVENTION

Figure 1:
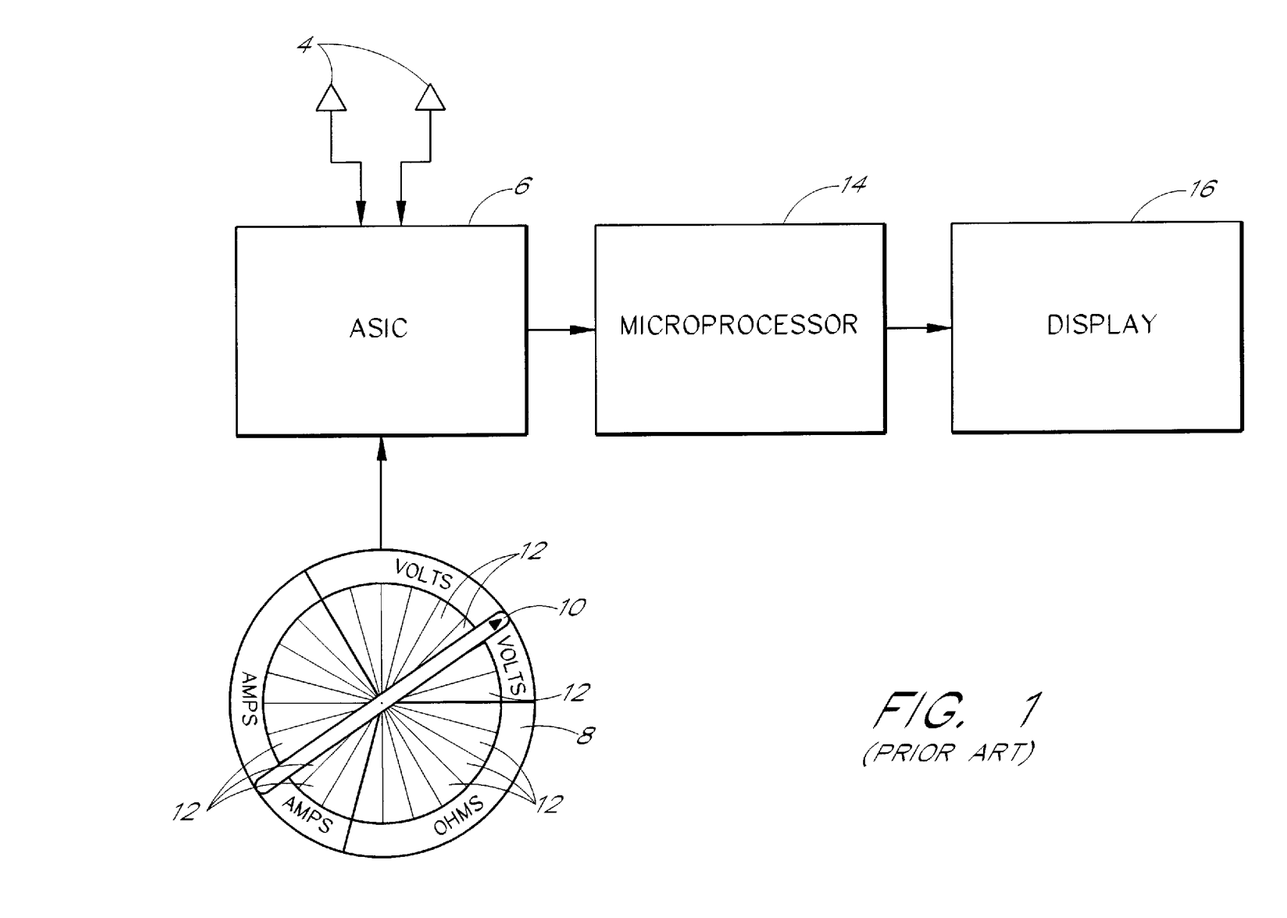
FIG. 1 is a block diagram of a prior art digital multimeter.

Digital multimeters are devices that perform several different metering functions. For example, a typical digital multimeter has three operating modes wherein it alternately functions as either an ammeter, an ohmmeter or a voltmeter. FIG. 1 illustrates a prior art digital multimeter 2. Digital multimeter 2 includes a pair of terminals 4 that are utilized to couple to a device or circuit across which a meter reading is to be taken. Rotary switch 8 enables digital multimeter 2 to alternatively select one of its various functions. The function of digital multimeter 2 is selected by positioning the movable portion 10 (with the arrow) of rotary switch 8 within an angular zone for the selected function. Within each function angular zone, rotary switch 8 is further subdivided into a plurality of ranges 12. Each range 12 corresponds to an expected input to the meter within a given function. For example, one range within the volt function could correspond to 0–100 volts. This range could be used if the expected input fell between 0 and 100 volts, a second range could correspond to an expected result of 0–1000 volts, etc. In general, a range is selected where the expected input is in the middle of the range since the sensitivity of the meter circuit decreases on the input ranges with higher maximum values.

The pair of terminals 4 and rotary switch 8 are each coupled to an application specific integrated circuit 6 (hereafter ASIC). ASIC 6 contains circuitry that receives the signals input from the pair of terminals 4 and converts them into output signals in a digital format that is readable by microprocessor 14; the manner in which the signals are converted is dependent upon the function and range selected by rotary switch 8. ASIC 6 provides the output signals to microprocessor 14 which converts them into display signals readable by display 16. The display signals are provided from microprocessor 14 to display 16 which displays the multimeter reading for the device or circuit coupled to the pair of terminals 4.

In the prior art digital multimeter 2, the connection between ASIC 6 and microprocessor 14 is unidirectional in that data is passed only from ASIC 6 to microprocessor 14. As a result, the interface between these two devices is fairly simple. However, digital multimeter 2 suffers from a disadvantage in that rotary switch 8 must be utilized to select the desired function and range and rotary switches are complicated and expensive to manufacture. In addition, such switches contain electromechanical contacts which are subject to corrosion and contamination by dirt.

Accordingly, it is an object of the present invention to provide a digital multimeter having means for enabling the desired function and range to be input into a microprocessor and thereby eliminate the need for a rotary switch.

When the function and range are input into a microprocessor, the interface between the microprocessor and the ASIC becomes bidirectional because information must be passed in each direction therebetween. Accordingly, it is a further object of the present invention to provide a simple bidirectional bus for coupling the microprocessor to the ASIC. It is a further object of the invention to provide a bidirectional bus having general applicability such that it can be utilized in other applications to couple various other devices.

Several techniques are known for implementing bidirectional buses between two or more devices. These techniques generally utilize one or more dedicated data bits, a clock signal for synchronizing the operation of the devices in communicating across the bus and one or more control lines for determining which device has control of the data bus. However, it is desirable to limit the number of wires needed to implement the bidirectional bus. Accordingly, it is a further object of the present invention to implement the bidirectional data bus using a minimum number of wires.

Other prior art methods exist for transferring information between two devices over a two wire bus. One of these methods is called the Inter-Integrated Circuit (IIC) method and was developed by Signetics, Inc. for use in local area networks (LANs). The IIC information transfer method utilizes a data line and a clock line. Data is serially transferred over the data line between the two devices under control of clock information on the clock line. The data is transferred in multi-bit messages which are delineated by "start" and "stop" bits. The start and stop bits are identified by data transitions which occur during the "active" portion of a clock cycle. The IIC method also uses addresses to identify a particular device to which a message is to be sent so that the method is suitable for use in multi-device systems such as LANs. Special contention rules are used to prevent simultaneous use of the bus by two devices.

Although the IIC method is suitable for use in a LAN environment, it is often too complicated for use in arrangements where there are only two devices, as in electronic multimeter circuits. In addition, the necessity of detecting data transitions in order to identify the start and stop bits, requires clocked gates or one-shot multivibrators. These latter devices are complicated and therefore consume a large area on an integrated circuit chip. Therefore, it is another object of the present invention to provide a method for bidirectional data transfer over two wires in which clocked gates or multivibrators are not necessary.

Further, as will be discussed in detail below, it is also necessary for the bidirectional bus to be designed in such a manner that each device can positively signal the other device regardless of the state that the other device is in. Such a capability is necessary in a power-on startup condition and in certain busy conditions. Prior art signalling methods did not have such capability. Accordingly, it is still a further object of the invention to provide a two-wire bidirectional information transfer system which allows one device to positively signal the other device.

SUMMARY OF THE INVENTION

The present invention is directed toward a method of implementing a two wire bidirectional data bus for intercoupling a first and second device in which the two busses are arranged in a wired-AND configuration so that each device can signal the other device by forcing one of the two-wires into a "low" condition. In addition, the method uses serial transfer of a predetermined numbers of bits in a digital word delimited by start and stop bits. However, the start and stop bits are chosen to be in a particular state during the "active" portion of the clock signal. Thus, the need for clocked gates or multivibrators is eliminated.

More particularly, the first and second devices are inter-coupled by first and second wires. A clock signal is provided by one of the devices onto the second wire and oscillates between active and inactive states. The multiple bits of a data block are serially placed onto the first wire by the first device with data changing on the first wire only when the clock signal is in the inactive state. The first device can signal the second device by placing a "strobe" signal onto the first wire. This is done by forcing the first wire into a "low" state while the clock is in its active state. In response to the strobe signal, the second device operates upon the data block.

The second device can also signal the first device by forcing the signal on the second line to a "low" state, for example, when the second device is in a "busy" state.

DETAILED DESCRIPTION

Figure 2:
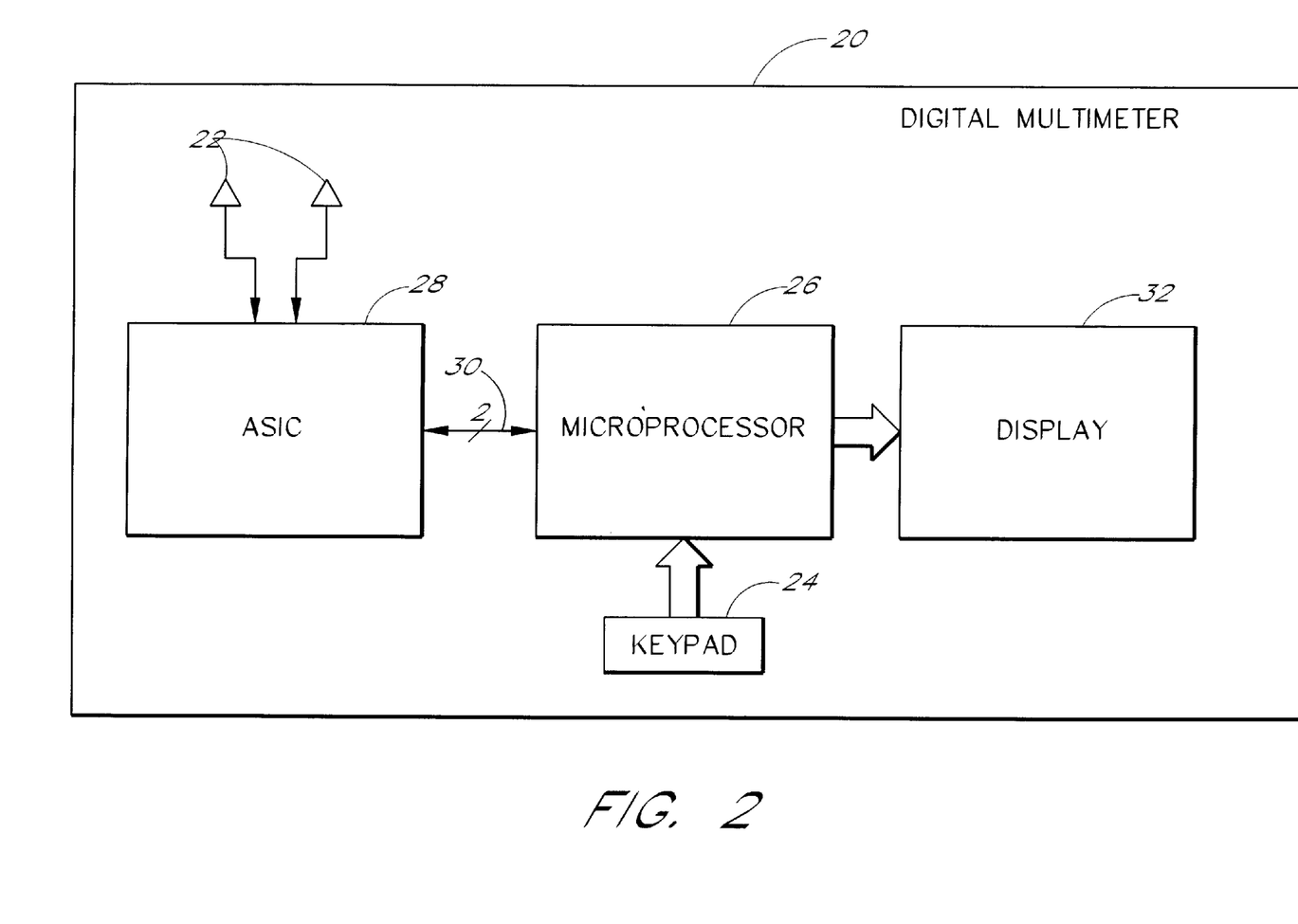
FIG. 2 is a block diagram of a digital multimeter incorporating the two wire bidirectional data bus of the present invention.

FIG. 2 is a block diagram of a digital multimeter 20 embodying the two wire bidirectional bus of the present invention. Digital multimeter 20 includes a pair of terminals 22 for coupling to a device or circuit for which a meter reading is desired. Digital multimeter 20 further includes a keypad 24 with which information relating to a desired function and range are entered by an operator. Keypad 24 is coupled to a microprocessor 26 that accepts and stores the function and range information. Microprocessor 26 is coupled to an ASIC 28 via a two wire bidirectional bus 30.

During operation, microprocessor 26 transfers the stored function and range information across bidirectional bus 30 to ASIC 28 in a manner that is fully described below. The function and range information is then stored in ASIC 28 and is utilized to configure circuitry (not shown) within ASIC 28 to convert the signals received from the pair of terminals 22 into a digital word representing the selected meter reading. The digital word representing the results of the meter reading are then stored within ASIC 28 in a manner that is more fully described below. When ASIC 28 completes its meter reading, the results are transferred, in a manner fully described below, from ASIC 28, across bidirectional bus 30 to microprocessor 26. Microprocessor 26 formats the meter reading result in a manner readable by display 32 and then transfers the results to display 32 where they are displayed.

As can be seen from FIG. 2, the digital multimeter 20 embodying the present invention provides an advantage over the prior art system shown in FIG. 1 in that keypad 24 is utilized to input the desired function and range information, thereby eliminating the necessity of using a rotary switch. However, by providing the function and range information to ASIC 28 via microprocessor 26, complexity is added to the interface between ASIC 28 and microprocessor 26 because this interface must be made bidirectional.

An important consideration in implementing bidirectional bus 30 is minimizing the number of wires needed for the bus. Application specific integrated circuits are typically provided by vendors in several configurations, each having a limited number of input/output (hereafter I/O) pins, as well as a limited amount of usable circuitry. Typically, a configuration having a larger number of I/O pins will be more costly than a configuration with fewer I/O pins. Additionally, configurations with more I/O pins are generally provided in larger packages. In implementing the digital multimeter 20 illustrated in FIG. 2, it is desirable to implement ASIC 28 in as small a package as possible so that the overall size of digital multimeter 20 can be minimized. In view of the foregoing, it is desirable to limit the number of I/O pins utilized by ASIC 28. Therefore, it is desirable to minimize the number of pins utilized to implement the interface between ASIC 28 and microprocessor 26.

As previously stated, the interface between ASIC 28 and microprocessor 26 is implemented via a two wire bidirectional bus 30. The manner in which the two wire bidirectional bus 30 is implemented depends upon whether or not the multiprocessor utilized is capable of providing bidirectional input/output pins as is more fully described below.

Figure 3A:
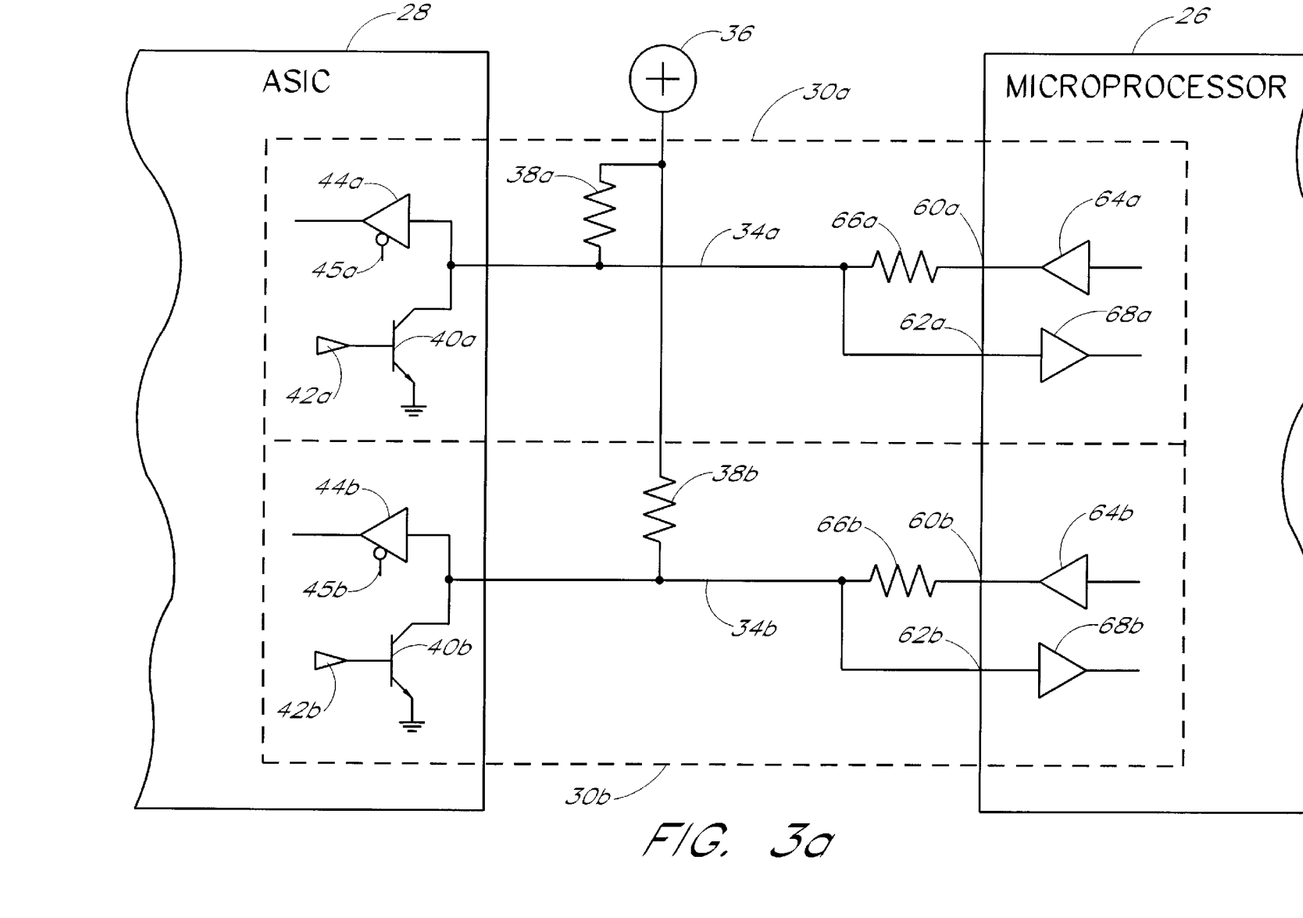
FIG. 3a is a schematic illustrating the manner in which the two wire bidirectional bus of the present invention is implemented in the preferred embodiment.

FIG. 3a illustrates the preferred embodiment of the invention wherein multiprocessor 26 does not utilize bidirectional I/O pins. Bidirectional bus 30 (FIG. 2) is a two wire bus that includes a data line 30a and a clock line 30b. Data line 30a and clock line 30b are respectively implemented with wires 34a and 34b that are pulled up to a positive supply voltage 36 through pullup resistors 38a and 38b. As a result, if neither ASIC 28 nor microprocessor 30 drives bidirectional bus 30 (FIG. 2), both lines will be high. In order to drive low logic values onto wires 34a and 34b, ASIC 28 has a pair of output transistors 40a and 40b. Output transistor 40a operates to drive a logic low value onto wire 34a in the following manner. When a control signal incident at its base 42a turns on output transistor 40a, wire 34a is short circuited to ground, thereby causing a logic low value to be incident on data line 30a. Output transistor 40b operates in a similar manner and enables ASIC 28 to force clock line 30b to have a logic low value.

Since microprocessor 26 does not utilize bidirectional I/O pins in this embodiment of the invention, four I/O pins are utilized to couple microprocessor 26 to bidirectional bus 30;

i.e. two output pins 60a and 60b and two input pins 62a and 62b. Output pins 60a and 60b are respectively driven by output drivers 64a and 64b and are respectively coupled to wires 34a and 34b through output resistors 66a and 66b. Through the use of output drivers 64a and 64b, microprocessor 26 can cause the signals incident on wires 34a and 34b to assume logic high or logic low states.

When microprocessor 26 desires to generate a logic high value on wire 34a, a high value is output from output driver 64a. As a result, output resistor 66a and pullup resistor 38a are configured in parallel as shown schematically in FIG. 4a. One end of each resistor is coupled to a high logic value and the other end of each resistor is coupled to wire 34a. As a result, wire 34a is pulled high through the parallel combination of pullup resistor 38a and output resistor 66a. Conversely, when microprocessor 26 desires to force a logic low value onto wire 34a, a low logic value is output from output driver 64a. As a result, output resistor 66a and pullup resistor 38a are configured in series as shown schematically in FIG. 4b. The end of output resistor 66a that is coupled to output pin 60a is forced to a logic low value while the other end is coupled to wire 34a. As a result, the voltage supplied by positive supply voltage 36 is divided across pullup resistor 38a and output resistor 66a. The value of output resistor 66a is chosen to be sufficiently small in comparison to the value of pullup resistor 38a to ensure that the voltage incident on wire 34a resulting from the voltage division is below the threshold voltage that ASIC 28 recognizes as a logic low value. As a result, microprocessor 26 can force wire 34a to a logic low value by generating a logic low value from output driver 64a. Output driver 64b, output resistor 66b and pullup resistor 38b function in a similar manner to enable microprocessor to generate either logic high or logic low values on clock line 34b.

Figure 4A:
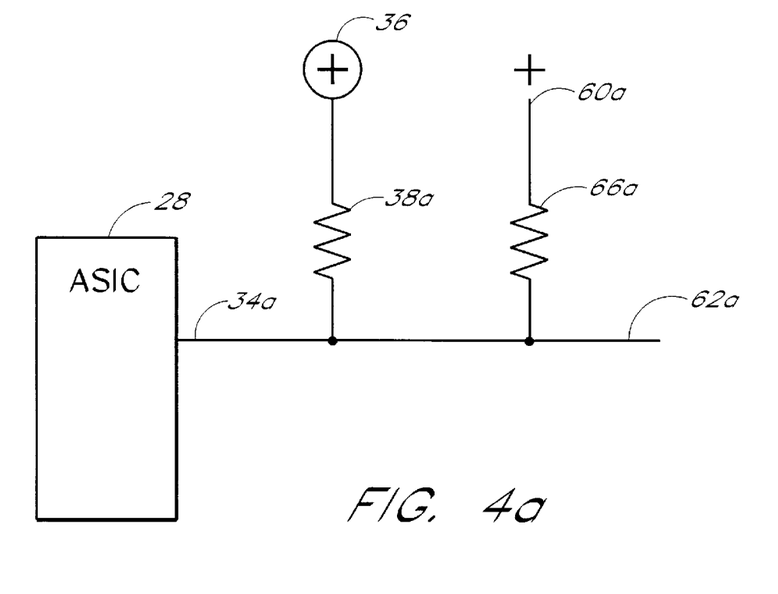
FIG. 4a is schematic diagram of the configuration of the pullup and output resistors of the embodiment shown in FIG. 3a when the microprocessor outputs a high logic value.
Figure 4B:
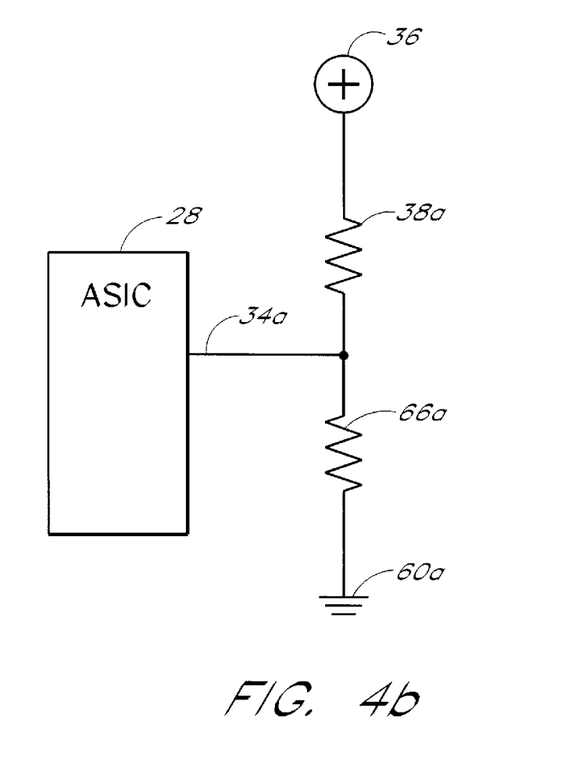
FIG. 4b is schematic diagram of the configuration of the pullup and output resistors of the embodiment shown in FIG. 3a when the microprocessor outputs a low logic value.

The coupling of microprocessor 26 to bidirectional bus 30 as shown in FIG. 3a also enables microprocessor 26 to receive data output from the bus that is output by ASIC 28. At all times other than when it is outputting data at a logic low value, microprocessor 26 outputs a logic high value onto output pin 60a. Therefore, pullup resistor 38a and output resistor 66a are configured in parallel as shown in FIG. 4a. In this configuration, ASIC 28 can pull wire 34a low to output a logic low value, or it can allow it to remain high to output a logic high value. As can be seen from FIG. 4a, input pin 62a is directly coupled to wire 34a so that the logic value incident on wire 34 is input to microprocessor 26 through input pin 62a. Output resistor 66a is necessary to enable microprocessor 26 to operate in the input mode described above. As can be seen from FIGS. 3a and 4a, if output resistor 66a were not utilized, output pin 60a and input pin 62a would be directly coupled to one another. As a result, when ASIC 28 generated a logic low value by clamping wire 34a low, input pin 62a would still be directly coupled to the logic high value output from output pin 60a. As a result, the logic high value output from output pin 60a would override the logic low value output from ASIC 28 so that logic low values output from ASIC 28 could not be read by microprocessor 26. It should be appreciated that although the above description has been specifically provided making reference to the data line 30a of bidirectional bus 30, clock line 30b operates in the same manner.

In the preferred embodiment of the invention, pullup resistors 38a and 38b have values of 100 k$\Omega$ and output resistors 66a and 66b have values of 10 k$\Omega$. Although numerous other combinations of resistor values could be used, there are two requirements that the resistor values should satisfy. First, as stated above, the output resistors 66a and 66b should have values relative to pullup resistors 38a and 38b that are sufficiently small to ensure that the division of the positive supply voltage across the output and pullup resistors results in a voltage below the threshold that ASIC 28 recognizes as a logic low value. Second, the value of output resistors 66a and 66b cannot be made too small because when ASIC 28 clamps wire 34a or 34b low, current is drawn into ASIC 28 from microprocessor 26 through either output resistor 66a or 66b. ASIC 28 is only capable of sinking a certain level of current without being damaged. Therefore, output resistors 66a and 66b should have sufficiently high values to ensure that the current flowing therethrough when ASIC 28 clamps wires 34a and 34b low does not exceed the maximum current that ASIC 28 can sink without being damaged.

As can be appreciated from the foregoing description, a wired-AND is formed between the output transistors 40a and 40b of ASIC 28 and the output drivers 64a and 64b of microprocessor 30, respectively. As a result of this wired-AND, either ASIC 28 or microprocessor 30 can force data line 30a or clock line 30b to have a logic low value.

ASIC 28 has a pair of input drivers 44a and 44b, the inputs of which are respectively coupled to wires 34a and 34b. Drivers 44a and 44b have sufficient load capacity that they can drive internal circuitry within ASIC 28 so that ASIC 28 can respond to activity on bidirectional bus 30. Drivers 44a and 44b, in a conventional fashion, can also be enabled or disabled by means of a "low" signal in leads 45a and 45b, respectively. Similarly, microprocessor 26 has a pair of input drivers 68a and 68b that are utilized to drive internal circuitry within microprocessor 26. However, input drivers 68a and 68b are always enabled because they have no means for being disabled. As shown in FIG. 3a, output drivers 64a and 64b of microprocessor similarly have no disabling means and are always enabled. As a result, the programmer of microprocessor 26 need not be concerned with switching the input and output drivers from one mode to another since they are always enabled.

Although pullup resistors 38a and 38b are provided in the preferred embodiment of the invention, they can alternatively be eliminated. If pullup resistors 38a and 38b were eliminated from the embodiment shown in FIG. 3a, output resistors 66a and 66b could respectively pull wires 34a and 34b high when microprocessor 26 outputs a high logic value onto those wires. Additionally, a low logic value could be produced by microprocessor 26 generating a low logic value on output pins 60a or 60b. Finally, even when microprocessor 26 generates a high logic value on output 60a or 60b, ASIC 28 could force those wires low in the same manner as is described above.

Figure 3B:
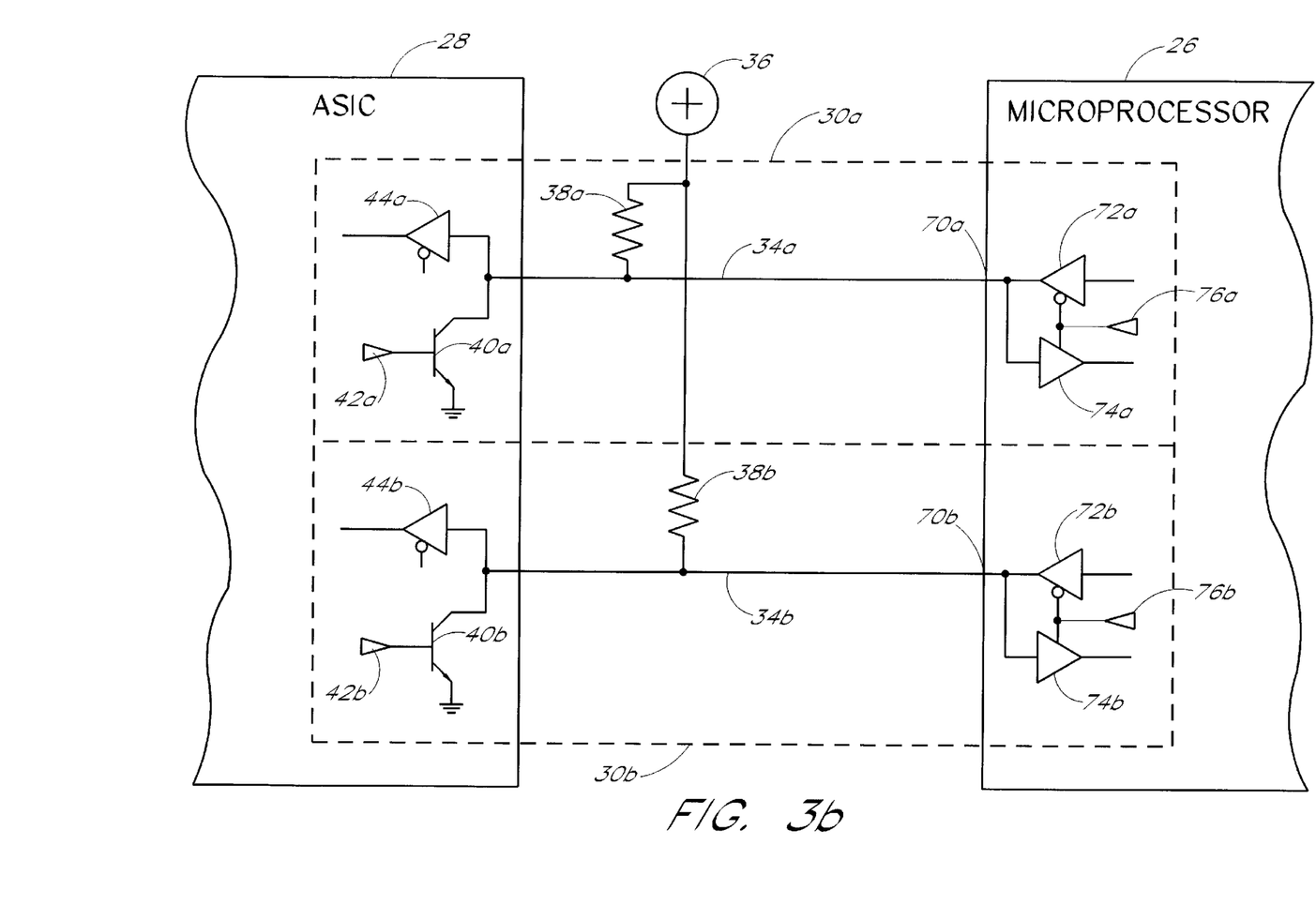
FIG. 3b is a schematic illustrating an alternate implementation of the two wire bidirectional bus of the present invention

In an alternate embodiment of the invention shown in FIG. 3b, a microprocessor 26 with bidirectional I/O pins is utilized so that two bidirectional I/O pins are utilized to couple to bidirectional bus 30. Output pin 70a of microprocessor 26 is coupled to a pair of drivers including output driver 72a and input driver 74a. Similarly, output pin 70b is coupled to a pair of drivers including output driver 72b and input driver 74b. The pairs of drivers are respectively coupled to control inputs 76a and 76b that enable only one driver from each pair to be active at any given time. As a result, for data line 30a, microprocessor 26 either enables its output driver 72a to output data thereto, or it enables its input driver 74a to receive data therefrom. When microprocessor 26 desires to generate a logic low value on data line 34a, output driver 72a outputs a logic low value that pulls data line 34a low. Conversely, microprocessor 26 can output a high logic value onto data line 34a. The interface to clock line 34b is accomplished in a similar manner.

In this embodiment of the invention, no output resistors are required at the output pins of microprocessor 26. When microprocessor 26 is in an input mode wherein it is configured to receive data from ASIC 28 across data line 30a, output driver 72a is disabled and achieves a tri-state condition. As a result, the signal output from output driver 72a will not override the data signal generated by ASIC 28 which is important for reasons that are described below. Clock line 30b can be operated in the same manner. In this embodiment of the invention, some complexity is introduced into the programming of microprocessor 26 because control inputs 76a and 76b must be controlled to determine whether each I/O pin is in its input or output mode.

Figure 5:
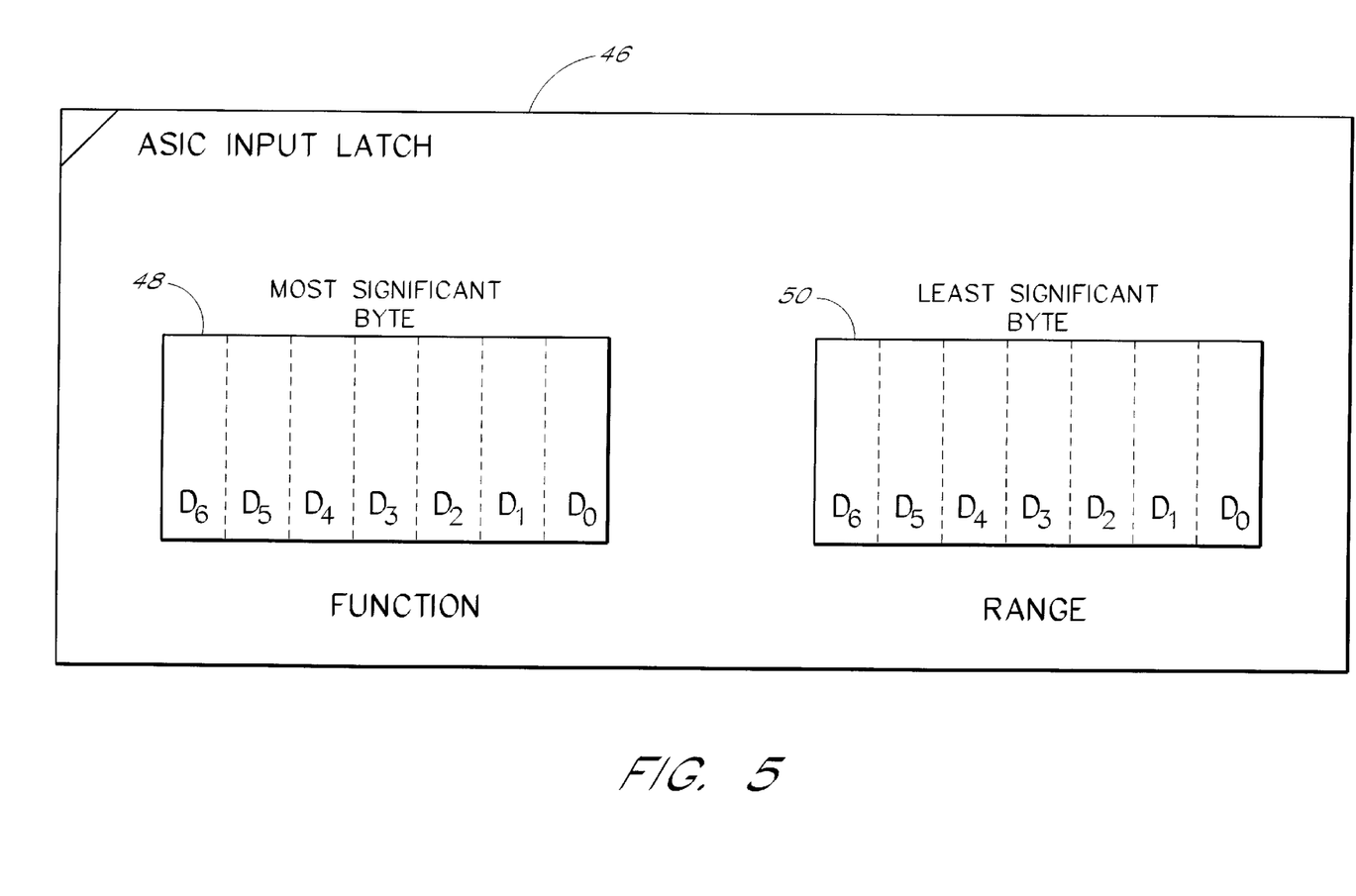
FIG. 5 is a block diagram of the ASIC input latch utilized in the preferred embodiment of the invention.

As described above, ASIC 28 receives the function and range information for a desired meter reading from microprocessor 26 via bidirectional bus 30. When this information is transferred to ASIC 28, it is stored in a fourteen-bit latch 46 illustrated in FIG. 5. The loading of latch 46 is controlled by the occurrence of a STROBE received from microprocessor 26; the manner in which microprocessor 26 executes a STROBE is fully described below. Latch 46 is implemented in two seven-bit bytes. Meter information regarding the desired function is stored in the most significant byte 48 and information regarding the desired range is stored in the least significant byte 50. only one byte of latch 46 is loaded with new data at any given time. The state of the data bit D6 being loaded into latch 46 determines which of the bytes is loaded. Upon the occurrence of a STROBE, the most significant byte 48 is loaded when input data bit D6 is in a high state and the least significant byte 50 is loaded when input data bit D6 is in a low state.

Figure 6:
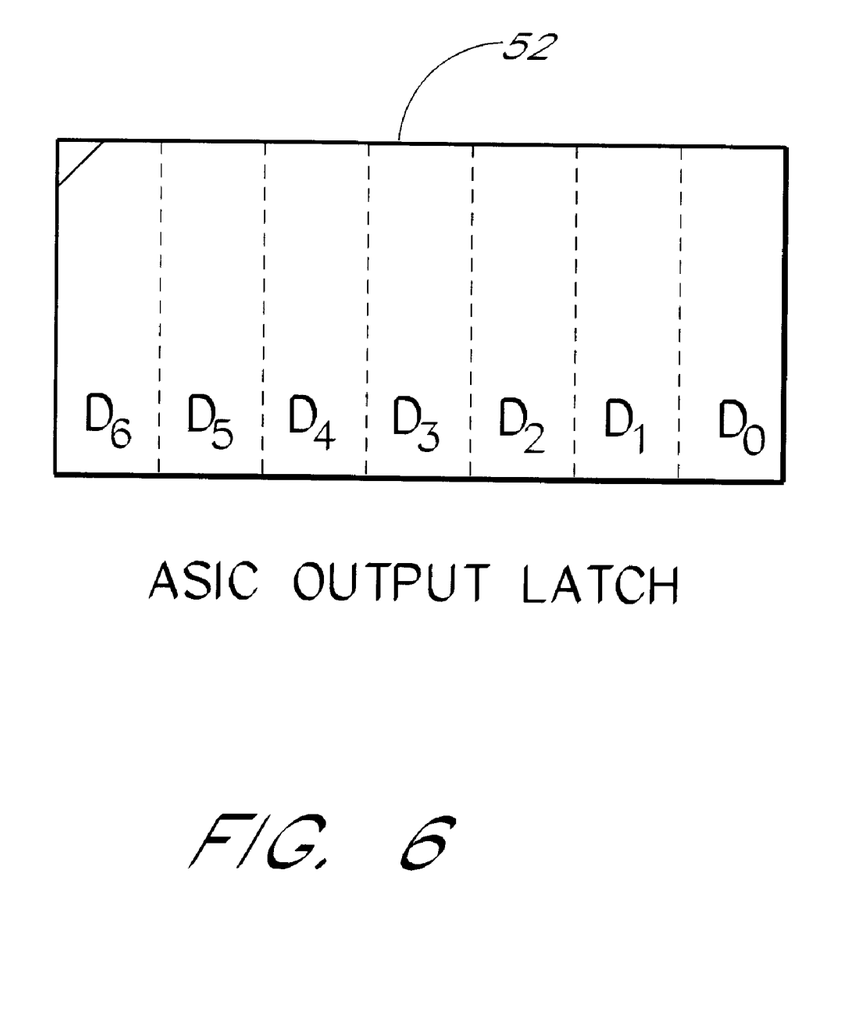
FIG. 6 is a block diagram of the ASIC output latch utilized in the preferred embodiment of the invention.

As described above, ASIC 28 outputs the results of a selected meter reading via bidirectional bus 30 to microprocessor 26 so that those results can be transferred to display 32. In order to facilitate the outputting of the meter results, ASIC 28 is provided with an ASIC output latch 52 as shown in FIG. 6. ASIC output latch 52 is loaded whenever microprocessor 26 executes a STROBE in the manner described below. The results of a desired meter reading are expressed in the form of a fourteen-bit data word. However, in order to reduce the amount of circuitry within ASIC 28, output latch 52 is only seven-bits wide. Therefore, in order for the full fourteen-bit word to be transferred out of ASIC 28 via output latch 52, output latch 52 is loaded twice, once with the most significant byte of the result word and once with the least significant byte of the result word. The most significant byte is loaded first into output latch 52, followed by the least significant byte. In this manner, the entire meter result word is passed through ASIC output latch 52. Although the use of a single seven-bit output latch reduces the circuitry utilized within ASIC 28, it should be understood that a fourteen-bit latch could also be utilized.

Figure 7:
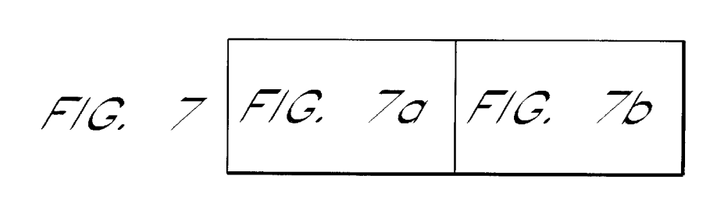
FIG. 7 is a timing diagram of the two wire bidirectional bus demonstrating the manner in which information is transferred from the microprocessor to the ASIC.
Figure 7A:
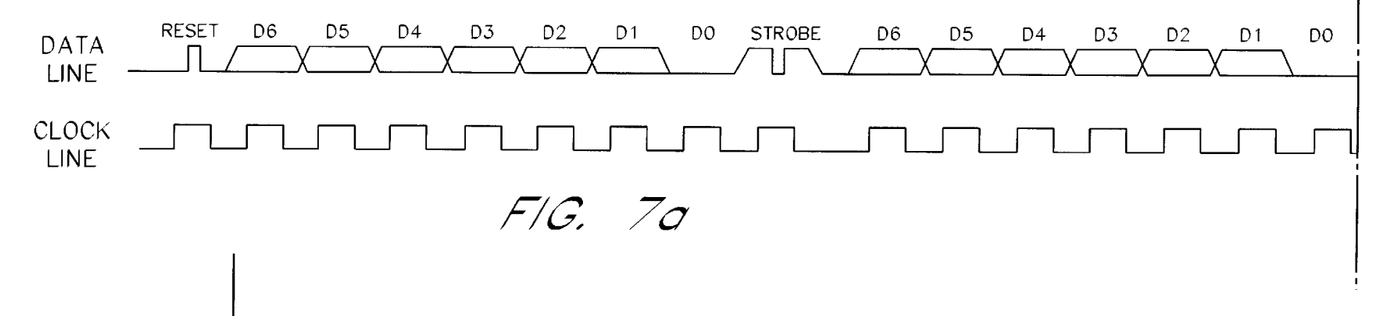
Figure 7B:
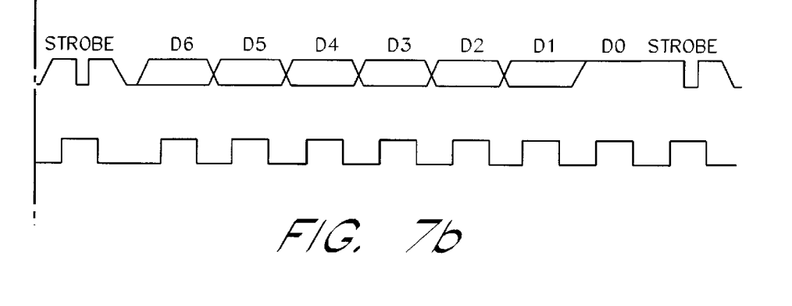
Figure 8:
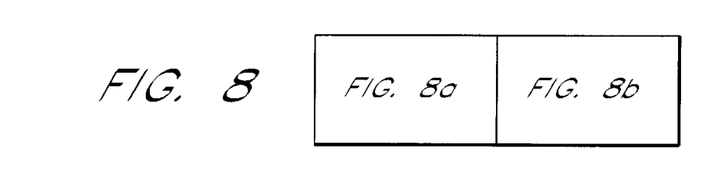
FIG. 8 is a timing diagram of the two wire bidirectional bus demonstrating the manner in which data is transferred from the ASIC to the microprocessor.
Figure 8A:
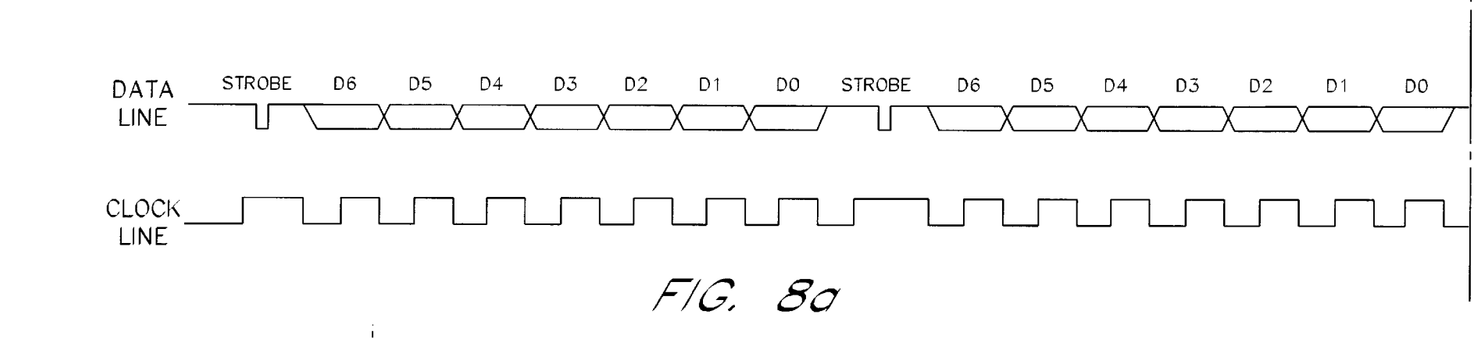
Figure 8B:
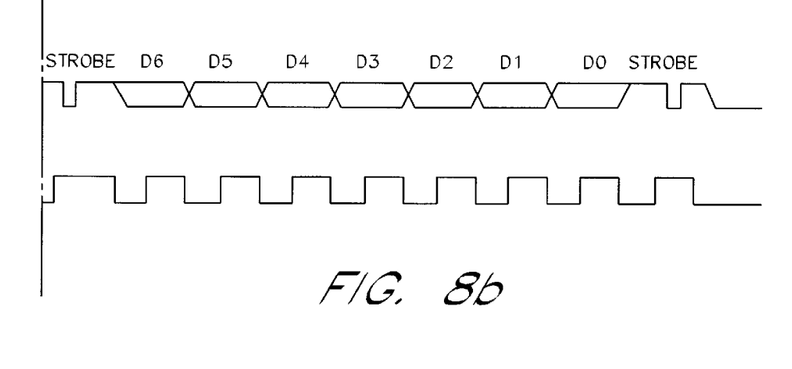

As previously mentioned, it is sometimes necessary for either the ASIC or the microprocessor to signal the other device. Such signalling is necessary in a power-up condition and during conversion operations performed by the ASIC. In order to perform this signalling special conditions are imposed on the bus wires. Reference is made to FIGS. 7 and 8 for an explanation of three special conditions (RESET, BUSY and STROBE) that are implemented on bidirectional bus 30. FIGS. 7 and 8 are timing diagrams of the signals incident upon bidirectional bus 30. The horizontal axis represents time increasing to the right and the vertical axis represents the logic state. Generally, there are two logic states: a "high" logic state represented by a signal level above the horizontal axis and a "low" signal level represented by a signal on the axis.

As illustrated in FIGS. 7 and 8, the RESET and STROBE conditions are the only times when data line 30a changes while clock line 30b is in its active or "high" state. A RESET is indicated by a positive "pulse" on data line 30a occurring while clock line 30b is high. For the purpose of this description, a "pulse" on data line 30a is defined by the line starting in a first state, transitioning to a second state, then returning to the first state, all the while clock line 30b remains active or "high". Since the RESET condition is the only time that a positive pulse occurs on data line 30a, ASIC 28 detects the occurrence of the RESET condition by detecting a positive pulse on data line 30a. In response to the RESET condition, ASIC 28 resets its internal circuitry to put itself into its input mode wherein it is configured to receive information regarding the function and range for a desired meter reading.

A STROBE signal is applied to ASIC 28 by microprocessor 26 by placing a negative pulse on data line 30a while clock line 30b remains in its active or "high" state. The STROBE signal is used by microprocessor 26 to control the latching of data in the input and output latches of ASIC 28.

A BUSY signal is used by ASIC 28 to inform microprocessor 26 that ASIC 28 is in the process of performing a conversion and cannot accept any new data or output any meter reading output results. The BUSY condition is indicated by ASIC 28 by forcing the clock line 30b into a "low" or inactive condition. ASIC 28 can also force line 30b "low" since ASIC 28 and microprocessor 26 are connected to line 30b in a wired-AND logic structure as previously mentioned.

As can be appreciated from the foregoing description, ASIC 28 is capable of operating at various times in different functional modes. First, it can operate in an input mode wherein it is configured to receive information from microprocessor 26 regarding the function and range of a desired meter reading. Second, it can operate in a conversion mode wherein a reading is taken of the signals incident upon the pair of terminals 22 and the signals are converted into a digital output word. Third, it can operate in an output mode wherein it transfers results of the meter reading into ASIC output latch 52 and across bidirectional bus 30 to microprocessor 26.

The RESET condition is controlled by microprocessor 26 and utilized to put ASIC 28 into its input mode. In the preferred embodiment of the invention, it is desirable to conserve I/O pins on ASIC 28 by eliminating the need for a dedicated power-up reset pin. Therefore, upon the initial application of power, ASIC 28 can be in any of its three operating states. ASIC 28 can be reset following a power-up of digital multimeter 20 by the microprocessor 26 forcing a RESET on bidirectional bus 30 in the following manner.

First, if ASIC 28 is powered up into its input mode wherein it awaits information regarding a function and range for a desired meter reading, no RESET is necessary because ASIC 28 is already in its desired mode. Second, if ASIC 28 is in its conversion mode upon power up, it will signal microprocessor 26 of this fact because ASIC 28 will force a BUSY condition on clock line 30b as is more fully described below.

When ASIC 28 is in the conversion mode, the conversion will be completed and it will eventually pass into its output mode. Therefore, when ASIC 28 is in the conversion mode, microprocessor 26 waits until it advances to its output mode before triggering a RESET in the manner described below.

Third, when ASIC 28 is in its output mode, it will eventually allow the data line to become "high", either after outputting data bit D0 as best shown in FIG. 8 or during data transfer when a "high" bit is output. Once ASIC 28 has allowed the data line to go high, microprocessor 26 has control over both lines of bidirectional bus 30 in that it can force either line to go low, or allow it to remain high. As a result, by controlling data line 30a and clock line 30b, microprocessor causes a positive pulse on data line 30a as shown in FIG. 7 to force a RESET that puts ASIC 28 into its input mode wherein it is configured to receive function and range information for a desired meter reading.

Therefore, by monitoring and controlling the data and clock lines, microprocessor 26 can eventually place ASIC 28 into the input mode no matter which mode ASIC 28 starts in during initial power up.

Reference is made to FIG. 7 for a description of the manner in which information regarding the desired function and range is transferred from microprocessor 26 to ASIC 28. Data is serially provided from microprocessor 26 across data line 30a, with one data bit being transferred within each cycle on clock line 30b. The data bits are represented by time periods marked D0, D1, . . . D6 in both FIGS. 7 and 8. Although the data is shown in both the "high" and "low" logic states for each bit, D1 . . . D6, in FIG. 7, in actuality, the data in each bit would be either "high" or "low". The dual representation is shown merely to indicate that each bit can arbitrarily be "high" or "low" depending on the information sent between the microprocessor 26 and ASIC 28. As discussed below, the value of the data in bit D0 figures in the operation of the data transfer apparatus for data transfers from the microprocessor 26 to the ASIC 28 and its value is not arbitrary.

After seven data bits have been transferred, microprocessor 26 forces a STROBE by causing a negative pulse to be placed on data line 30a as shown in FIG. 7. In response to a STROBE, either the most significant byte 48, or the least significant byte 50 of ASIC input latch 46 is loaded with the seven data bits that were incident upon data line 30a prior to the occurrence of the STROBE. The state of the most significant data bit D6 determines which of the bytes is loaded. If data bit D6 is high, the most significant byte 48 of ASIC input latch 46 is loaded with new data upon the occurrence of a STROBE. Conversely, if data bit D6 is low, the least significant byte 50 of ASIC input latch 46 is loaded upon the occurrence of a STROBE. By changing the state of the data bit D6, microprocessor 26 can alternately load latch 46 with the most and least significant data bytes.

ASIC 28 does not terminate its input mode and enter its conversion mode until the state of the least significant data bit Do loaded into either the most significant byte 48 or least significant byte 50 of ASIC input latch 46 enters a "high" state. In the preferred embodiment of the invention shown in FIG. 7, microprocessor 26 does not enable data bit D0 to enter a high state until both bytes of ASIC input latch 46 have been loaded with the relevant data for conducting a meter reading and the most significant byte has been sent to ASIC 28 for a second time (three byte transmissions total). In this manner, the circuitry within ASIC 28 is provided with a "settling" time period in order to configure itself to execute the proper meter reading. By delaying the assertion of data bit D0 in its high state until after both data bytes have been loaded, microprocessor 26 ensures that the circuitry within ASIC 20 has had sufficient time to configure itself to provide an accurate meter reading. The occurrence of a STROBE while data bit D0 is in a high state causes the D0 bit to be loaded into the ASIC input latch 46, which thereupon triggers ASIC 28 to exit its input mode and enter its conversion mode.

Once ASIC 28 enters its conversion mode, it requires some conversion time to generate a meter result data word in a form that can be read by microprocessor 26. During this conversion time, it is undesirable to have microprocessor 26 either: (1) attempt to send function and range information to ASIC 28 for a new meter reading; or (2) attempt to read the results from the pending meter reading before ASIC 28 has completed its conversion. As a result, as previously mentioned, it is desirable to provide some method for enabling ASIC 28 to inform microprocessor 26 that it is in a BUSY state wherein microprocessor 26 should not attempt to send to or receive information from ASIC 28.

In the preferred embodiment of the invention, ASIC 28 triggers a BUSY condition by clamping clock line 30b to a logic "low" value. During general operation, clock line 30b is controlled by microprocessor 26. Therefore, when microprocessor 26 detects that clock line 30b is clamped low by ASIC 28, it recognizes that ASIC 28 is in a BUSY state and does not provide data to nor attempt to read data from ASIC 28. ASIC 28 continues to clamp clock line 30b low until it has completed its conversion mode and has entered its output mode wherein it is prepared to transfer the result data word to microprocessor 26. Once ASIC 26 enters its output mode, it releases its clamp on clock line 30b to terminate the BUSY condition.

By unclamping clock line 30b, ASIC 28 provides microprocessor 26 with an indication that it has completed its conversion mode and entered its output mode. FIG. 8 is a timing diagram illustrating the manner in which information is transferred from ASIC 28 to microprocessor 26 during the output mode of ASIC 28. Microprocessor 26 controls the loading of the most significant byte of the result data word into ASIC output latch 52 by triggering a STROBE signal. Thereafter, the most significant byte of the result data word is serially provided out of ASIC 28 on data line 30a, one bit being transferred during each cycle on clock line 30b (microprocessor 26 controls the clock signals on line 30b to clock the data out of ASIC 28). After all seven bits of the most significant byte have been provided out of ASIC 28, microprocessor 26 triggers another STROBE, thereby loading the least significant byte of the result data word into ASIC output latch 52. Thereafter, the least significant byte of the result data word is serially provided out of ASIC 28 across data line 30a, one bit per each cycle on clock line 30b. For each successive STROBE issued by microprocessor 26, ASIC output latch 52 is loaded alternatively between the most significant and least significant bytes of the result data word. This alternate loading continues as long as ASIC remains in its output mode. The output mode of ASIC 28 is terminated by microprocessor 26 forcing a RESET which causes ASIC 28 to enter its input mode wherein it is configured to accept information regarding a function and range to execute a new meter reading. In this manner, microprocessor 26 can provide new function and range information to ASIC 28 to conduct a new meter reading in the manner described above.

It should be understood that although the preferred embodiment of the invention has been described as providing a two wire bidirectional data bus between a microprocessor and an ASIC within a digital multimeter, the present invention can generally be utilized to provide a bidirectional bus between other types of devices. The bidirectional bus of the present invention provides several key features that can be utilized to implement different control functions for implementing a bus between other types of devices. First, the recognition of a positive pulse (indicating a RESET in the preferred embodiment) as creating a special control command. Second, the recognition of a negative pulse (indicating a STROBE in the preferred embodiment) as creating a special control command. Third, the clamping of the clock line to indicate a special control command (indicating BUSY in the preferred embodiment). These broad features of the present invention can be utilized to implement a two wire bidirectional bus between many other types of devices. Although data transfers across the bidirectional bus are based upon seven-bit bytes in the preferred embodiment, data blocks having different numbers of bits also could be utilized for transferring data. Similarly, although the STROBE condition in the preferred embodiment signifies that ASIC 28 is to either store the data block previously transferred across the bidirectional bus or to begin its conversion mode, when used with other devices, a negative strobe could be utilized to signal a device to operate upon data in numerous other ways that relate to the nature of a given device.

It should be understood that various changes and modifications of the embodiment shown in the drawings may be made within the scope of this invention. Thus, it is intended that all matter contained in the above description as shown in the accompanying drawings shall be interpreted in an illustrative and not limiting sense.

What is claimed is:

1. A method of transferring data between a first device and a second device intercoupled by a data line and a clock line, the method comprising the steps of:

A. controlling the first device to generate a clock signal on the clock line, the clock signal oscillating between an active state and an inactive state;

B. controlling the first device in response to the clock signal generated in step A to sequentially generate a plurality of data bits on the data line, each of the data bits comprising a data signal which has at least two logic levels and changes between the logic levels only when the clock signal is in the inactive state;

C. controlling the first device to generate a strobe pulse signal on the data line after the plurality of data bits have been generated, the strobe pulse signal changing from a first logic value to a second logic value and back to the first logic value while the clock signal is maintained constant in the active state;

D. receiving the plurality of data bits, the clock signal and the strobe signal in the second device;

E. controlling the second device to perform an operation upon the plurality of data bits in response to the reception of the strobe signal in step D;

F. controlling the second device to clamp the clock line to a predetermined logic value during step E; and G. controlling the first device to monitor the clock line, the first device refraining from generating data bits on the data line while the clock line is clamped to the predetermined logic value.

2. A method of transferring data between a first device and a second device as claimed in claim 1 further including the step of:

H. controlling the second device to release the clock line at the completion of step E.

3. A method of transferring data between a first device and a second device intercoupled by a data line and a clock line, the method comprising the steps of:

A. controlling the first device to generate a clock signal on the clock line, the clock signal oscillating between an active state and an inactive state;

B. controlling the first device in response to the clock signal generated in step A to sequentially generate a plurality of data bits on the data line, each of the data bits comprising a data signal which has at least two logic levels and changes between the logic levels only when the clock signal is in the inactive state;

C. controlling the first device to generate a strobe pulse signal on the data line after the plurality of data bits have been generated, the strobe pulse signal changing from a first logic value to a second logic value and back to the first logic value while the clock signal is maintained constant in the active state;

D. receiving the plurality of data bits, the clock signal and the strobe 18 signal in the second device;

E. controlling the second device to perform an operation upon the plurality of data bits in response to the reception of the strobe signal in step D;

F1. controlling the second device to monitor a predetermined one of the plurality of data bits received in step D;

F2. controlling the second device to clamp the clock line to a first predetermined logic value during step E when the predetermined one of the plurality of data bits received in step D has a second predetermined logic value; and G. controlling the first device to monitor the clock line, the first device refraining from generating data bits on the data line while the clock line is clamped to the first predetermined logic value.

4. A method of transferring data between a first device and a second device intercoupled by a data line and a clock line, the method comprising the steps of:

A. controlling the first device to generate a clock signal on the clock line, the clock signal oscillating between an active state and an inactive state;

B. controlling the first device in response to the clock signal generated in step A to sequentially generate a plurality of data bits on the data line, each of the data bits comprising a data signal which has at least two logic levels and changes between the logic levels only when the clock signal is in the inactive state;

C. controlling the first device to generate a strobe pulse signal on the data line after the plurality of data bits have been generated, the strobe pulse signal changing from a first logic value to a second logic value and back to the first logic value while the clock signal is maintained constant in the active state;

D. receiving the plurality of data bits, the clock signal and the strobe signal in the second device;

E. controlling the second device to perform an operation upon the plurality of data bits in response to the reception of the strobe signal in step D;

F. controlling the second device to clamp the clock line to a predetermined logic value during step E;

G. controlling the first device to monitor the clock line, the first device refraining from generating data bits on the data line while the clock line is clamped to the predetermined logic value;

H. controlling the second device to release the clock line at the completion of step E;

I. controlling the first device to generate a strobe pulse signal on the data line at the completion of step H; and J. controlling the second device in response to the strobe pulse signal generated in step I to sequentially generate a plurality of data bits on the data line, each of the data bits comprising a data signal which has at least two logic levels.

5. A method of transferring data between a first and second device as claimed in claim 4 further comprising the step of:

K. controlling the first device to generate a clock signal having an active and an inactive state on the clock line during step J, the data bits generated during step J changing between the logic levels only when the clock signal is in the inactive state.

6. A method of transferring data between a first device and a second device intercoupled by a data line and a clock line, the method comprising the steps of:

A. controlling the first device to generate a clock signal on the clock line, the clock signal oscillating between an active state and an inactive state;

B. controlling the first device in response to the clock signal generated in step A to sequentially generate a plurality of data bits on the data line, each of the data bits comprising a data signal which has at least two logic levels and changes between the logic levels only when the clock signal is in the inactive state;

C. controlling the first device to generate a strobe pulse signal on the data line after the plurality of data bits have been generated, the strobe pulse signal changing from a first logic value to a second logic value and back to the first logic value while the clock signal is maintained constant in the active state;

D. receiving the plurality of data bits, the clock signal and the strobe signal in the second device;

E. controlling the second device to perform an operation upon the plurality of data bits in response to the reception of the strobe signal in step D;

F. controlling the first device to generate a reset pulse signal on the data line, the reset pulse signal changing from the second logic value to the first logic value and back to the second logic value while the clock signal is in the active state;

G. receiving the reset pulse signal at the second device; and

H. placing the second device in a predetermined state in response to the reception of the reset signal in step G.

* * * * *

UNITED STATES PATENT AND TRADEMARK OFFICE
CERTIFICATE OF CORRECTION

PATENT NO. : 5,898,890
DATED : Apr. 27, 1999
INVENTOR(S) : Jerry J. Heep, et al

It is certified that error appears in the above-indentified patent and that said Letters Patent is hereby corrected as shown below:

In Claim 3, in column 12 at line 14, delete "18".

Signed and Sealed this

Fifth Day of October, 1999

Attest:

Q. TODD DICKINSON

*Attesting Officer*  *Acting Commissioner of Patents and Trademarks*